US007856606B2

(12) United States Patent
Eurlings et al.

(10) Patent No.: US 7,856,606 B2
(45) Date of Patent: Dec. 21, 2010

(54) APPARATUS, METHOD AND PROGRAM PRODUCT FOR SUPPRESSING WAVINESS OF FEATURES TO BE PRINTED USING PHOTOLITHOGRAPHIC SYSTEMS

(75) Inventors: Markus Franciscus Antonius Eurlings, Tilburg (NL); Melchior Mulder, Veldhoven (NL); Thomas Laidig, Point Richmond, CA (US); Uwe Hollerbach, Franklin, MA (US)

(73) Assignee: ASML MaskTools B.V., Veldhoven (NL)

( * ) Notice: Subject to any disclaimer, the term of this patent is extended or adjusted under 35 U.S.C. 154(b) by 1169 days.

(21) Appl. No.: 11/092,983

(22) Filed: Mar. 30, 2005

(65) Prior Publication Data

US 2006/0010417 A1 Jan. 12, 2006

(51) Int. Cl.
*G06F 17/50* (2006.01)
(52) U.S. Cl. .............................. 716/2; 716/19; 716/20; 716/21
(58) Field of Classification Search ............. 716/19–21, 716/2–5; 430/5, 30; 382/144
See application file for complete search history.

(56) References Cited

U.S. PATENT DOCUMENTS

| 5,969,441 | A | 10/1999 | Loopstra et al. |
|---|---|---|---|
| 5,991,006 | A | 11/1999 | Tsudaka |
| 6,014,456 | A | 1/2000 | Tsudaka |
| 6,046,792 | A | 4/2000 | Van der Werf et al. |
| 6,154,563 | A | 11/2000 | Tsudaka |
| 6,248,485 | B1 | 6/2001 | Cuthbert |
| 6,249,597 | B1 | 6/2001 | Tsudaka |
| 6,625,801 | B1 | 9/2003 | Pierrat et al. |
| 6,665,856 | B1 | 12/2003 | Pierrat et al. |
| 6,907,596 | B2 | 6/2005 | Kobayashi et al. |
| 7,384,710 | B2 | 6/2008 | Ogawa et al. |
| 2002/0100004 | A1* | 7/2002 | Pierrat et al. .................... 716/5 |
| 2003/0110465 | A1 | 6/2003 | Zhang |
| 2003/0170551 | A1 | 9/2003 | Futatsuya |
| 2005/0055658 | A1* | 3/2005 | Mukherjee et al. ............ 716/19 |
| 2005/0153217 | A1* | 7/2005 | Izuha et al. .................... 430/5 |
| 2007/0006118 | A1* | 1/2007 | Pierrat et al. .................. 716/21 |

FOREIGN PATENT DOCUMENTS

JP 11-121361 4/1999

(Continued)

OTHER PUBLICATIONS

European Search Report issued in corresponding European Patent Application No. 05252042.6, dated Jan. 25, 2007.

(Continued)

*Primary Examiner*—Paul Dinh
(74) *Attorney, Agent, or Firm*—Pillsbury Winthrop Shaw Pittman LLP

(57) ABSTRACT

A method for minimizing rippling of features when imaged on a surface of a substrate using a mask. The method includes the steps of determining a deviation between a first representation of the design and a second representation of an image of the design at each of a plurality of evaluation points for each section of a plurality of sections of the design; determining an amount of modification of the design at each section based on an evaluation of the plurality of evaluation points; and modifying the design at each section by the amount determined in the previous step.

18 Claims, 12 Drawing Sheets

FOREIGN PATENT DOCUMENTS

| | | |
|---|---|---|
| JP | 11121361 | 4/1999 |
| JP | 2000100692 | 4/2000 |
| JP | 2001183804 | 7/2001 |
| JP | 2002250999 | 9/2002 |
| JP | 2003-59809 | 2/2003 |
| JP | 2003059809 | 2/2003 |
| JP | 2003287871 | 10/2003 |
| JP | 2005215587 | 8/2005 |
| JP | 2009034095 | 2/2009 |
| KR | 1998-033229 | 7/1998 |
| WO | 98/40791 | 9/1998 |
| WO | 03/067331 | 8/2003 |

OTHER PUBLICATIONS

Korean Office Action issued in Korean Patent Application No. KR 10-2005-0027091, mailed Jan. 14, 2008.

\* cited by examiner ial (resist). In general, a single wafer will contain a whole network of adjacent target exposure fields that are successively irradiated via the projection system, one at a time. In one type of lithographic projection apparatus, each target exposure field is irradiated by exposing the entire mask pattern onto the target exposure field in one go; such an apparatus is commonly referred to as a wafer stepper. In an alternative apparatus—commonly referred to as a step-and-scan apparatus—each target exposure field is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

APPARATUS, METHOD AND PROGRAM PRODUCT FOR SUPPRESSING WAVINESS OF FEATURES TO BE PRINTED USING PHOTOLITHOGRAPHIC SYSTEMS

FIELD OF THE INVENTION

The present invention relates to photolithography, and in particular suppressing waviness of features printed using photolithographic systems.

BACKGROUND

Lithographic apparatus can be used, for example, in the manufacture of integrated circuits (ICs). In such a case, the mask used in manufacture may contain a circuit pattern corresponding to an individual layer of the IC, and this pattern can be imaged onto a target exposure field (e.g. comprising one or more dies) on a substrate (silicon wafer) that has been coated with a layer of radiation-sensitive mater In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple-stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). However, because of the increasingly microscopic size of lithographic features and high resolution systems, the resulting features printed on the substrate tend to have some rippling, i.e., edges that are supposed to be straight are not straight. This rippling is related to "ringing" in filter theory, and is a natural side effect of efforts to accentuate the high spatial frequencies needed to image small features. Others factors that may cause rippling are known by those of ordinary skill in the art. FIG. 1 illustrates features printed on a substrate suffering from the problem of rippling.

In the current state of the art, model-based OPC accounts for mismatch between a target image and predicted image using the following steps. (1) A target layer is divided into a plurality of sections. (2) A predicted image is evaluated at one "evaluation point" (typically at the center) of each section of the plurality of sections. (3) Based on respective evaluations, features to be printed are modified by modifying the mask in accordance with the respective evaluation at the center of the corresponding section to minimize the mismatch between the target and predicted image. In low k1 systems with the occurrence of rippling, or where rippling is more prevalent, the conventional model based OPC methods accentuate rippling in cases where the evaluation points happen by chance not to be placed in ideally representative locations within their respective sections.

For instance, FIG. 2 illustrates a target image 20 superimposed on a predicted image 22, which has rippling. The target image 20 is divided into a plurality of sections 24, and the images 22, 24 are evaluated at evaluation points 26 for each section 24. Each evaluation point 26 is located at the center of the respective section 24. Based on these evaluations, the target image is modified (modified mask 30), as illustrated by FIG. 3. The modified mask takes into account the mismatch between the target image 20 and predicted image 22. With respect to the evaluation at the center of each of the plurality of sections 24, an offset of Δn is applied with respect to the target image 20, where n represents the corresponding section 24. In other words, the resulting new edge is adjusted downwardly in each place where the original predication was high, and is adjusted upwardly in each place where the original prediction was low, as would be expected.

FIG. 4 illustrates the new predicted image 40 based on the modified mask 30. By comparison with the predicted image 22, conventional model based OPC techniques accentuates rippling of the new predicted image 40, which increases the likelihood of breaking or bridging depending on surrounding structure.

Improved results can in principle be obtained by choosing a "better" evaluation point, and some limited strategies exist in this regard. In particular, the evaluation points of sections at or near corners may be moved back away from that corner to avoid over-correction. These methods are helpful, but are difficult to apply except in simple cases due to the complexity of the interaction between surrounding contextual features and the ripples observed on a particular edge of interest. Currently, there are no optimization and model methods for minimizing mismatch between a target image and predicted image that take into account rippling.

SUMMARY

The teachings herein alleviate the above noted problems and provide a novel a method of optimizing a design to be formed on a substrate. The method includes the steps of determining a deviation between a first representation of the design and a second representation of an image of the design at a plurality of evaluation points for each section of a plurality of sections of the design; determining an amount of modification of the design at each section based on an evaluation of the plurality of evaluation points; and modifying the design at each section by the amount determined in the previous step.

Further enhancements include identifying a section type for each of the plurality of sections and determining whether each section type corresponds to a corner of the design. When the section type corresponds to the corner, modification of the design at the section corresponding to the corner may not be performed. Alternatively, when the section type corresponds to the corner, it may be determined whether the corner is a concave corner or a convex corner. If the corner is the concave corner, a minimum deviation value from the plurality of evaluation points of the section is determined, and the design is modified at the corner section based on the minimum deviation value. If the corner is the convex corner, the a maximum deviation value is utilized.

Even further enhancements include determining an evaluation method for each section of the plurality of sections according to each section type, evaluating the deviation at each section according to each evaluation method selected, and modifying the design at each of the plurality of sections based on the results of the evaluations. Each evaluation method may be selected from a group consisting of minimum, maximum, middle, mean and median.

Still further enhancements include for a given section of the plurality of sections, determining the deviation at each of the evaluation points of the given section, determining the deviation at each of a predetermined number of evaluation points of a section adjacent to the given section, and modifying the design at the given section based on an evaluation of the deviation at each of the evaluation points from the two previous steps. Also, the design at a corner section may be modified simply by an adjustment factor.

Yet even further enhancements include for a given section evaluating the plurality of evaluation points of the given section by determining at least two deviation values comprising a first deviation value for the given section based on a first evaluation method and a second deviation value for the given section based on a second evaluation method, determining a resulting deviation value based on the at least two deviation values, and modifying the design by modifying a design at the given section based on a result of the previous step. The first evaluation method may be selected from a group consisting of minimum, maximum, middle, mean and median and the second evaluation method may correspond to a different method selected from the group.

Additional objects, advantages and novel features will be set forth in part in the description which follows, and in part will become apparent to those skilled in the art upon examination of the following and the accompanying drawings or may be learned by production or operation of the examples. The objects and advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accord with the present teachings, by way of example only, not by way of limitation. In the figures, like reference numerals refer to the same or similar elements.

DESCRIPTION

The novel concepts discussed herein improve model-based OPC for predicted features that have ripples or a waviness characteristic, as shown in FIGS. 1-5. Because of the waviness, the inventors have found that by evaluating each section 24 at a plurality of evaluation points 50 (See FIG. 5), and basing the OPC model on these multiple evaluations, errors that occur using the conventional model based OPC techniques can be suppressed.

Figure 1:
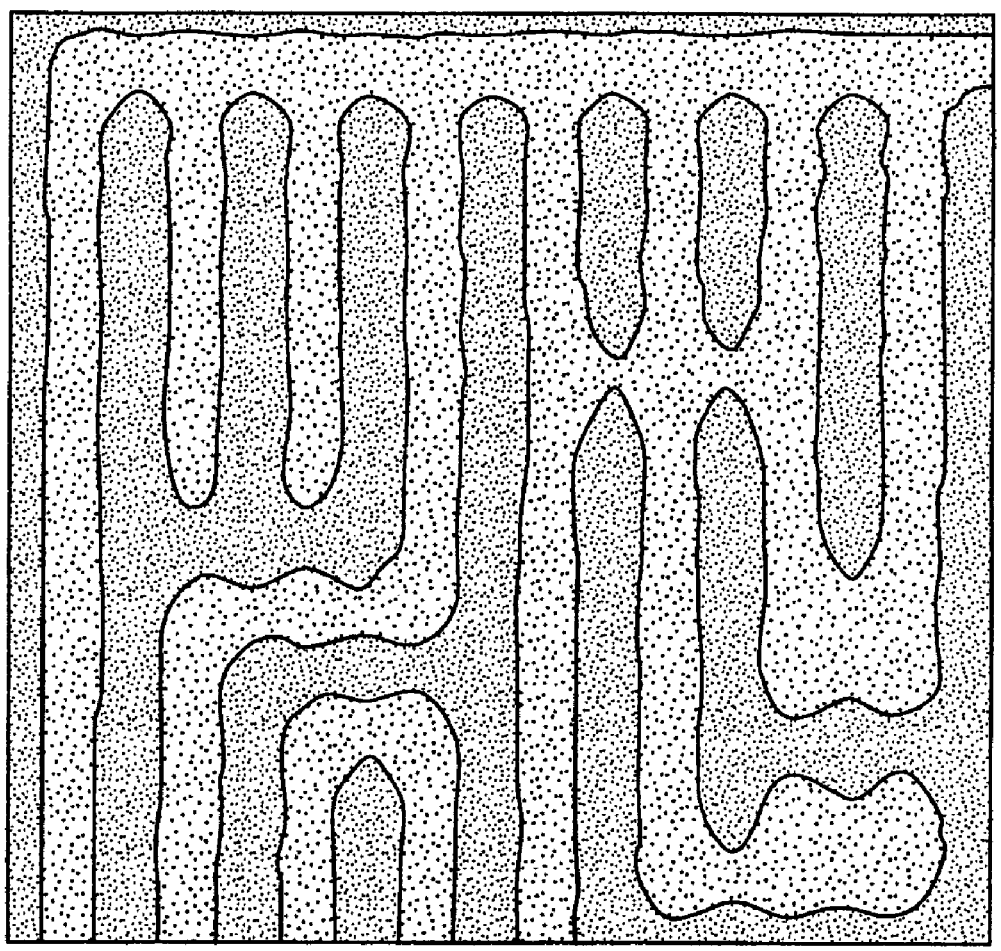
FIG. 1 illustrates exemplary features printed on a substrate suffering from rippling.
Figure 2:
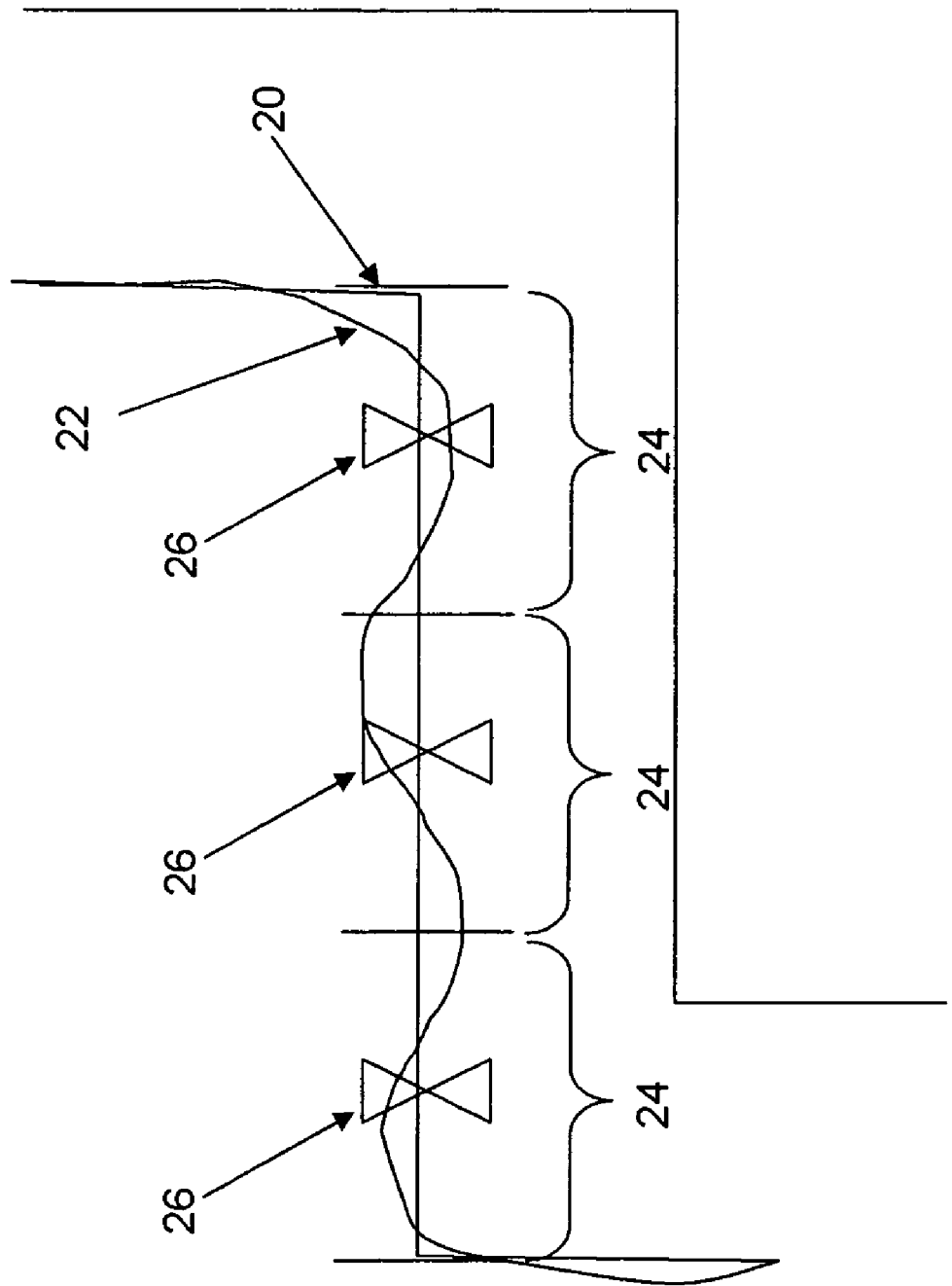
FIG. 2 illustrates an exemplary target image and corresponding predicted image suffering from rippling.
Figure 3:
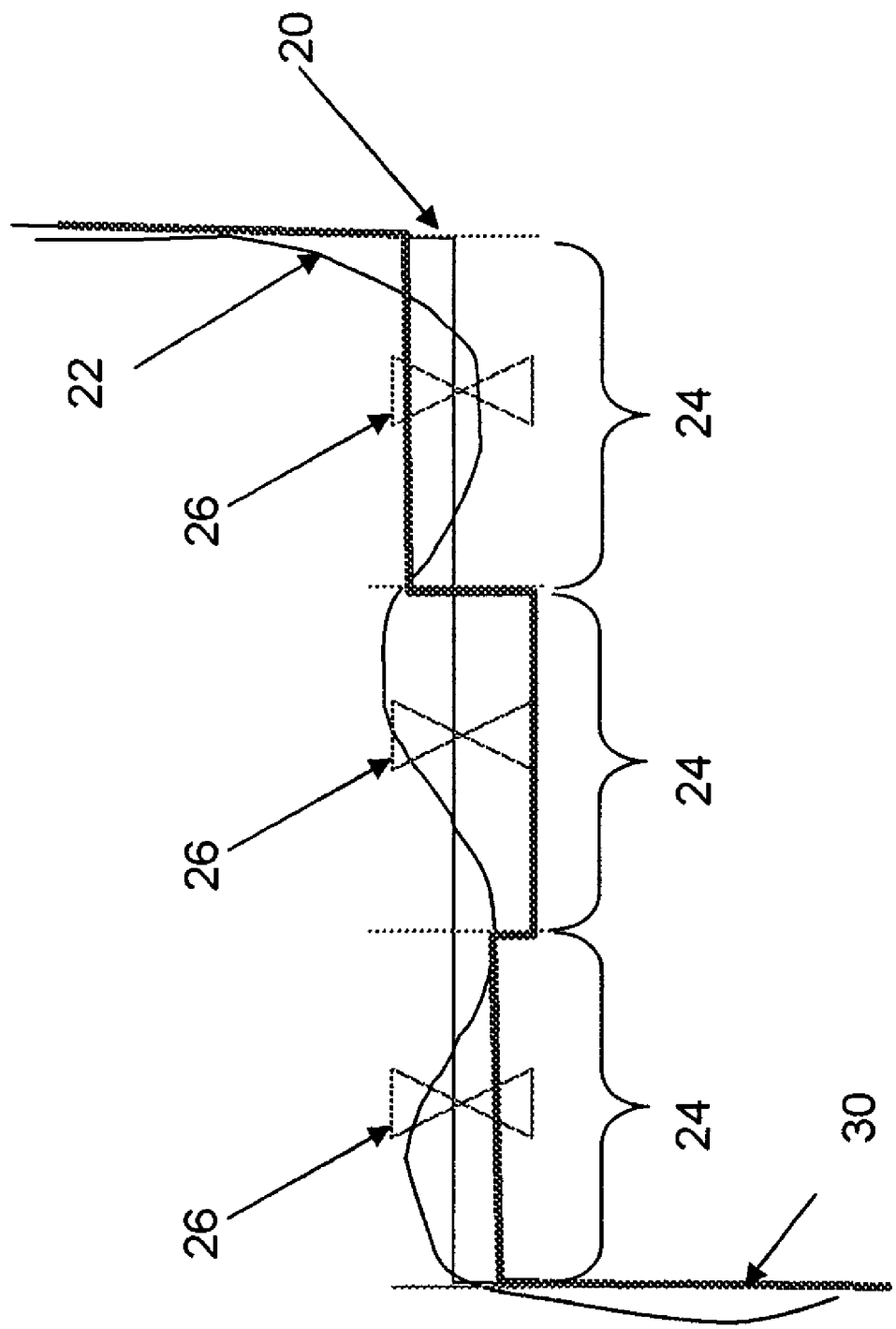
FIG. 3 illustrates the target and predicted images of FIG. 2 and an exemplary modified mask based on the evaluation of the images of FIG. 2.
Figure 4:
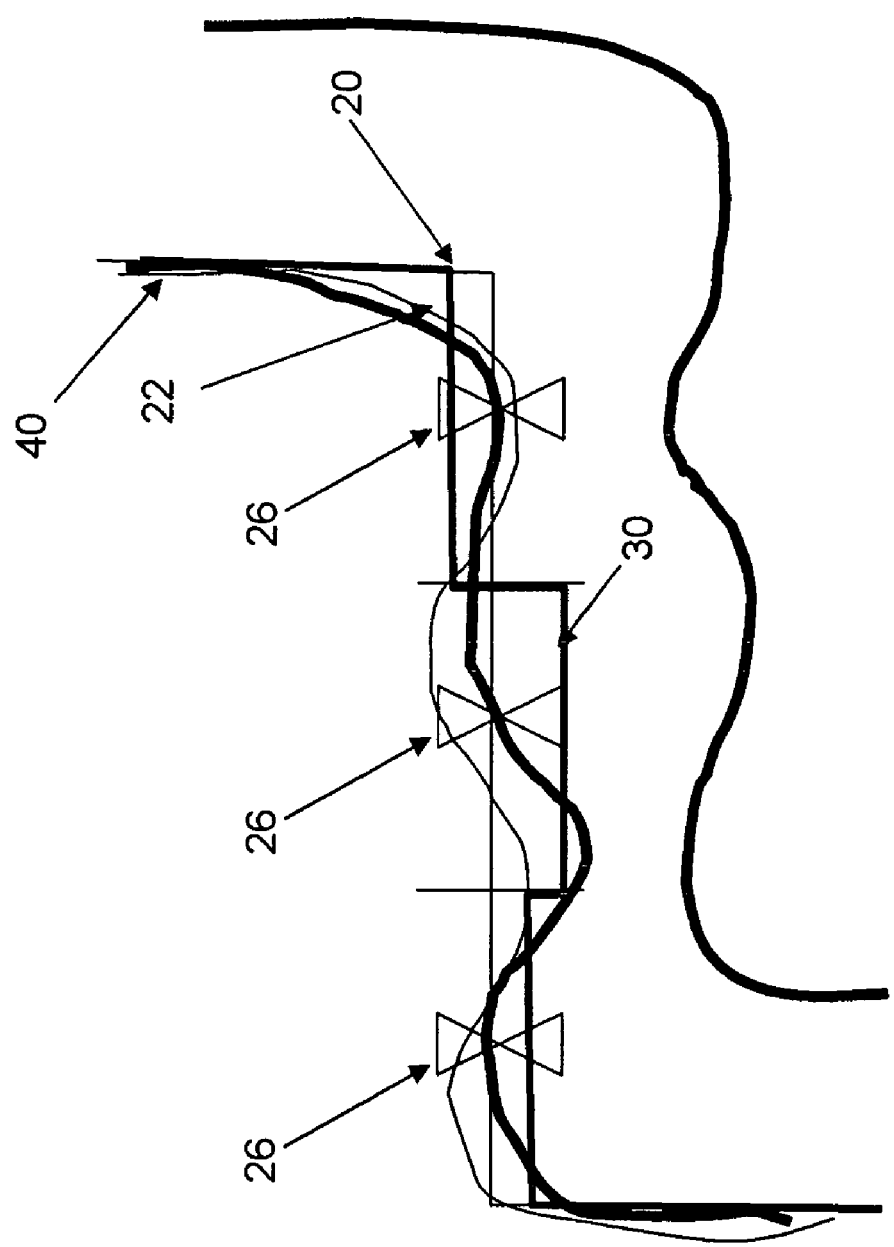
FIG. 4 illustrates an exemplary predicted image based on the modified mask of FIG. 3.
Figure 5:
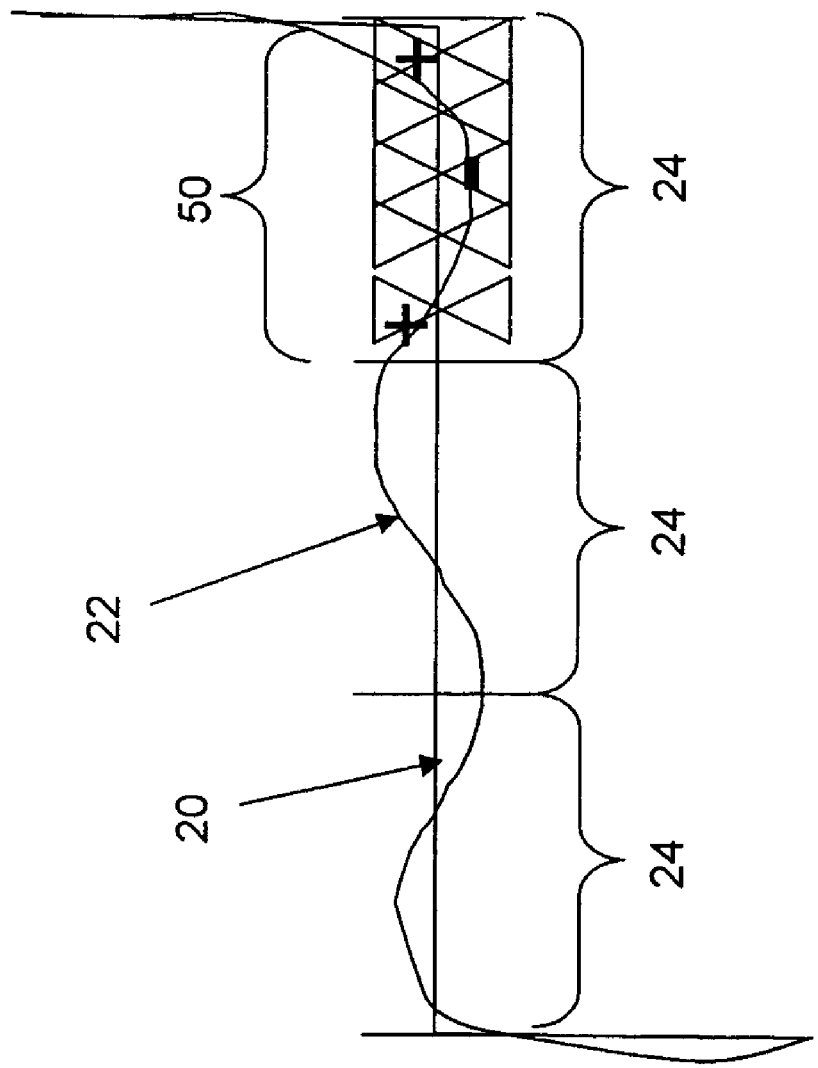
FIG. 5 illustrates the exemplary target image and predicted image of FIG. 2 that is evaluated in accordance with the disclosed concepts.

FIG. 5 illustrates a target feature 20 and predicted feature 22 similar to that illustrated by FIG. 2. As before, the features are divided into a plurality of sections 24. However, for each section of the plurality of sections 24, evaluations are taken at a plurality of evaluation points 50. The number of evaluation points may depend on the complexity of the features to be printed, the amount of rippling, the accuracy desired, the computation time for each section 50 or any combination of the foregoing.

In contrast to the conventional manner, instead of modifying a mask based on a single evaluation point taken at the center of each corresponding section (See FIG. 4), the disclosed concepts suggest modifying the mask based on multiple evaluations for each corresponding section of the plurality of sections 24. The inventors have devised several ways to evaluate error measurements taken for each of the plurality of evaluation points 50; each of which are discussed below.

Any calculation taking into account the multiple evaluation points 50 in each section 24 may be used for determining the necessary correction. At each evaluation point, the deviation error between the target image and the predicted image is determined. These deviation errors are evaluated further to determine necessary modification, if any, to the mask. Exemplary calculation methods include determining the average (or taking the arithmetic mean) of the deviation errors for a section, determining the median of the deviation errors of a section. Other examples include choosing the minimum error value or choosing the maximum error value of the evaluations at a section 24. Determining the middle (average of maximum error and minimum error values) may be utilized as well.

Each calculation method mentioned above has its advantages. As such, different calculation methods may be employed depending on the features in section 24. In other words, a calculation method may be selected that is best suited for characteristics of the target image and predicted image in the respective section 24.

Modification of corner sections or sections near corners should minimize corner rounding as much as possible. Corners are typically divided into two sections, one section for each side, and a plurality of evaluation points are evaluated for each section. The mask may be modified according to the minimum deviation error value of the plurality of evaluation points for sections 24 near concave corners whereas the maximum value may be used for sections 24 near convex corners.

In order to increase the robustness of the new model described herein, evaluation points of adjacent section(s) 24 may be factored into the calculation for a primary section 24. To put it another way, sections 24 may overlap one another, so that a modified mask has more of a smooth transition from a corresponding one section to another. However, for sections 24 at corners, there is no overlap with an adjacent section. To accommodate for this, an adjustment factor may be applied to evaluations points nearing a corner or at a corner. Alternatively, analysis of evaluation points nearing and located at a corner may be obviated entirely.

The inventors have devised even another method for calculating a correction factor at each section, which includes taking the average of the minimum value, maximum value, and middle result. Middle, as defined herein, is an average of the maximum and minimum. This has several advantages. Use of minimum-only results in excessive bridging, maximum-only results in excessive pinching, and middle-only avoids excessive pinching and bridging, but does not suppress the rippling effect as average alone does. However, by taking the average of the three, excessive bridging, excessive pinching, and superior suppression of the rippling effect can be accomplished.

Figure 6:
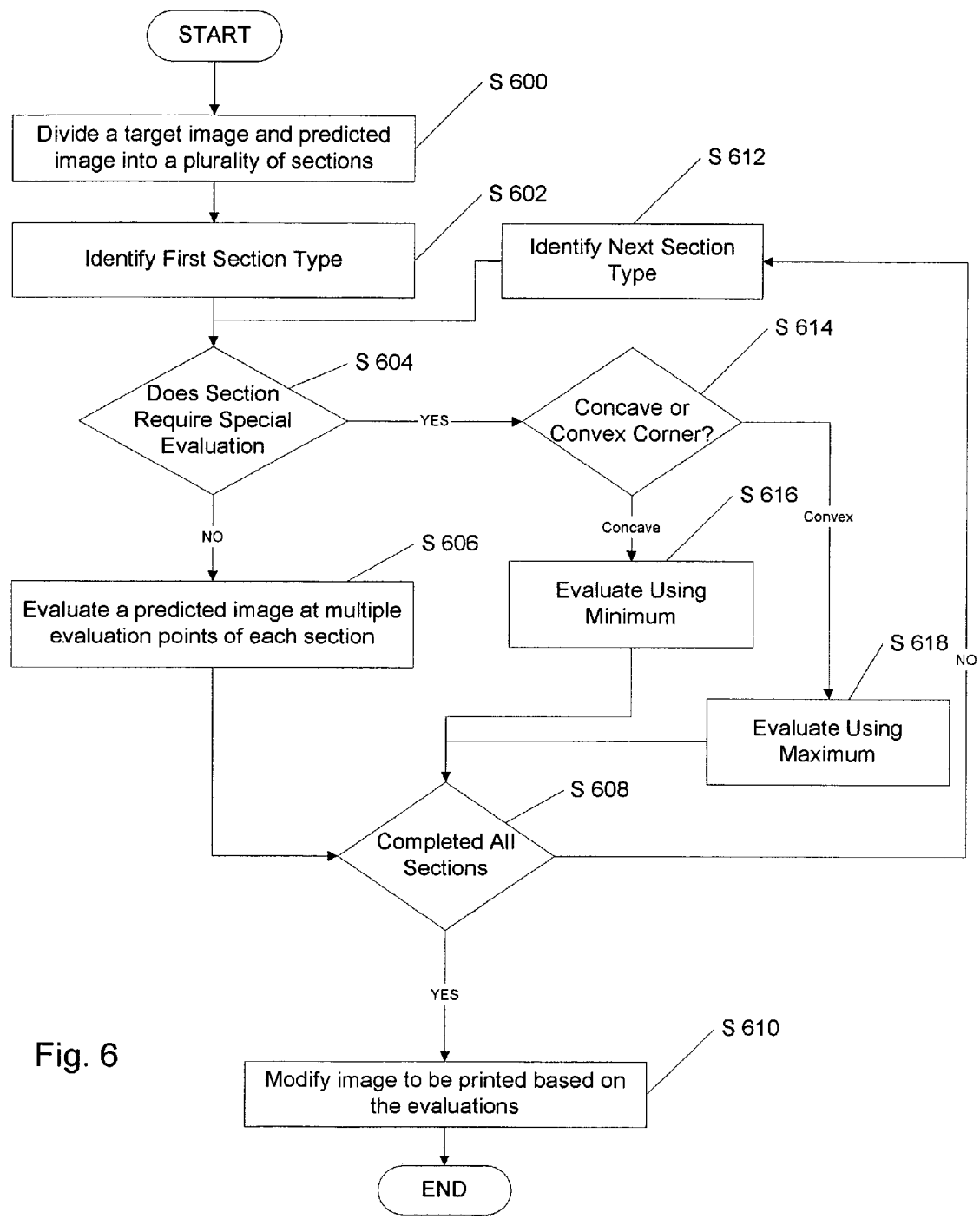
FIG. 6 illustrates a flowchart for evaluating representations of designs to be formed on a substrate in accordance with the disclosed concepts.

FIG. 6 illustrates an exemplary flowchart of the evaluation methods described above. In the figure and herein, "Step" is abbreviated by the letter "S." In S 600, a target image and a predicted image (i.e., a representation of the design to be imaged on the substrate and a representation of the image of the design on the substrate, respectively) is divided into a plurality of sections, e.g. the plurality of sections 24 illustrated by FIG. 5. The size of each section may depend on the desired accuracy. Smaller sections increasingly reduce the rippling affect but require increased computation time, whereas larger sections do not. In S 602, each section type may be identified. Section types include a corner or those other than a corner. The section type may be identified by manual inspection or software analysis. Both techniques are well within the level of those of ordinary skill in the art. In S 604, it is determined whether the section requires special evaluation. An example of sections requiring special evaluation may include corner sections. If no special evaluation is required, in S 606 the deviation error at each evaluation point of the section is determined and evaluated. Exemplary evaluation methods were described above to include minimum, maximum, middle, mean and median, as well as other techniques. However, other known evaluation methods may be utilized to determine the amount of modification required for a section. In S 608, if all sections have been evaluated, the mask is modified in accordance the evaluations. Exemplary modification is illustrated by FIG. 5 (S 610).

If evaluation of all sections has not been completed (S 608), the next section type is identified (S 612). Again, it is determined whether the section that has been identified requires special evaluation (S 604). Considering a corner section, in S 604, it may be determined that a corner requires special evaluation. In S 614, it is determined whether the section is a convex corner or a concave corner. Techniques of identifying whether a section is a convex or a concave section type are well within the level of one of ordinary skill in the art. If the section is concave, the evaluation is performed using the minimum deviation value of the multiple evaluation points (S 616). If the section is convex, the evaluation is performed using the maximum deviation value of the multiple evaluation points (S 618). Once all section evaluations have been completed, the mask is modified by adjusting each section according to the evaluations performed (S 610).

FIGS. 7-11 illustrate simulations performed using minimum, maximum, middle, mean and median calculation methods, respectively. In each figure, the target section is shown by the number 702, the corrected mask pattern is shown by the number 704, and the predicted printing results by number 706. Areas A1-A4 designated in each of the figures have been chosen for comparing the effects of bridging, necking (or pinching), line smoothing, and average line width, respectively. Table 1 compiles comparative results for each of the calculation methods simulated and characteristics of the predicted image.

TABLE 1

Figure 7:
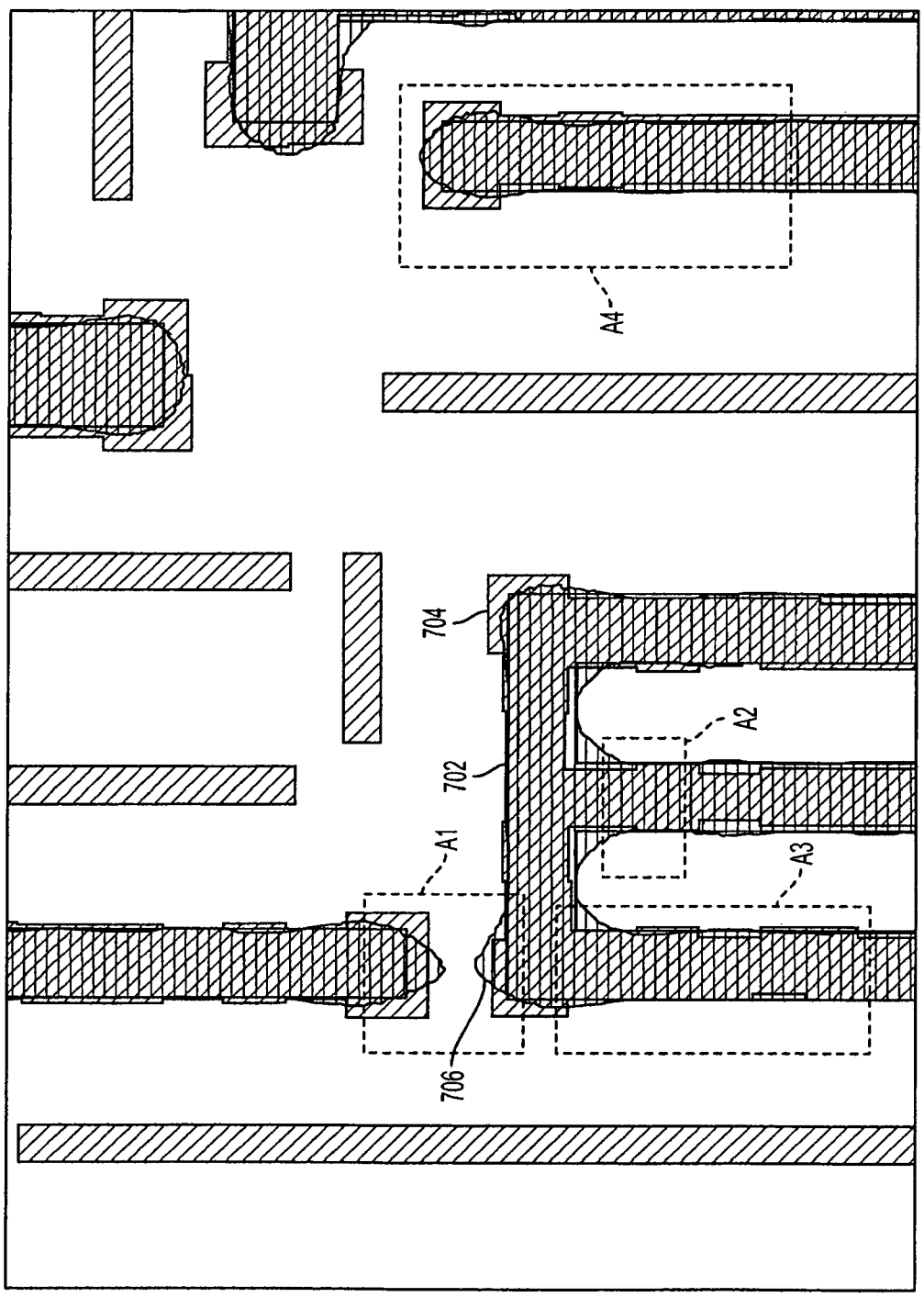
FIG. 7 illustrates an exemplary target image, predicted image and modified mask design based on the minimum deviation value for each section.
Figure 8:
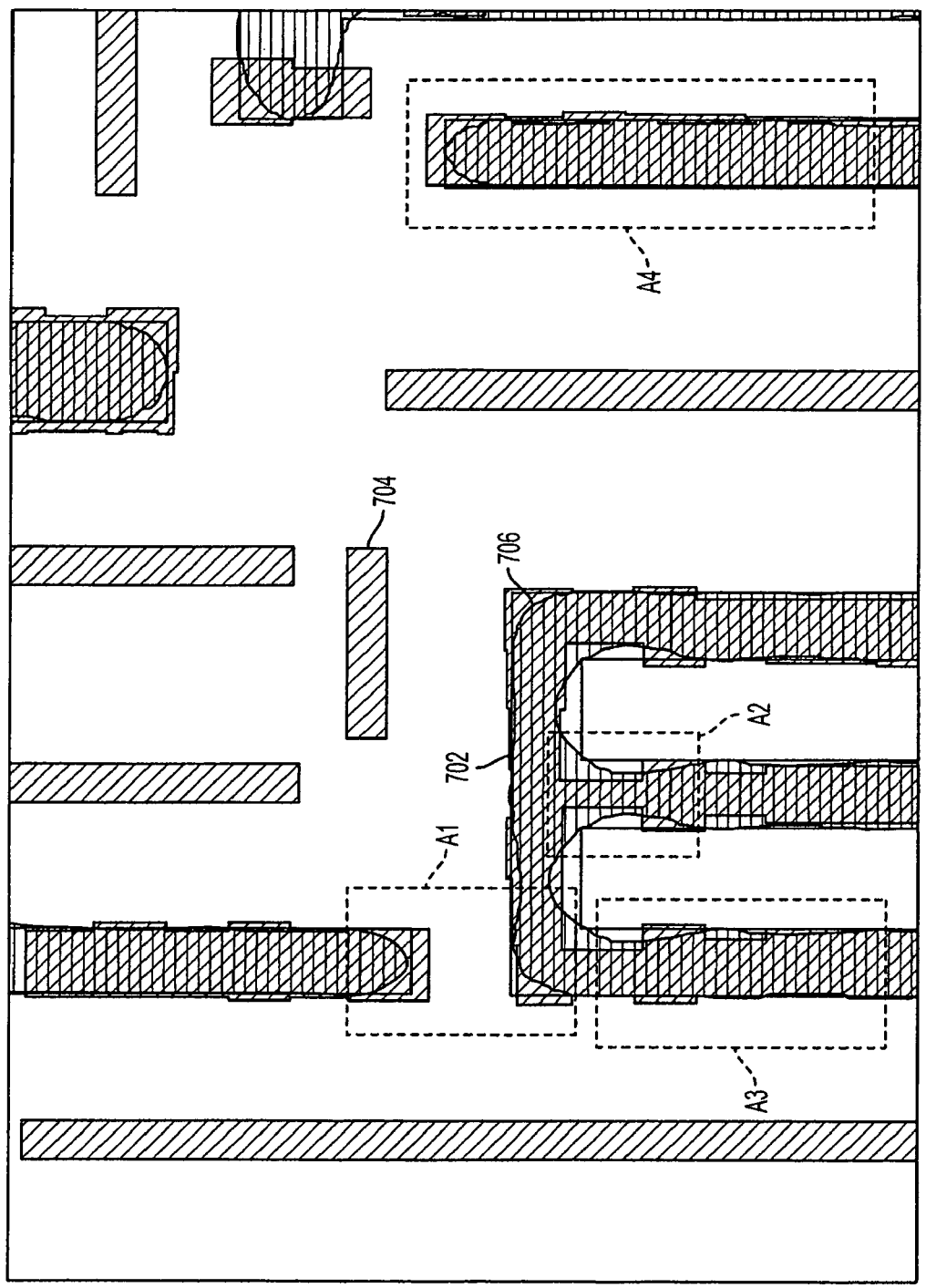
FIG. 8 illustrates an exemplary target image, predicted image and modified mask design based on the maximum deviation value for each section.
Figure 9:
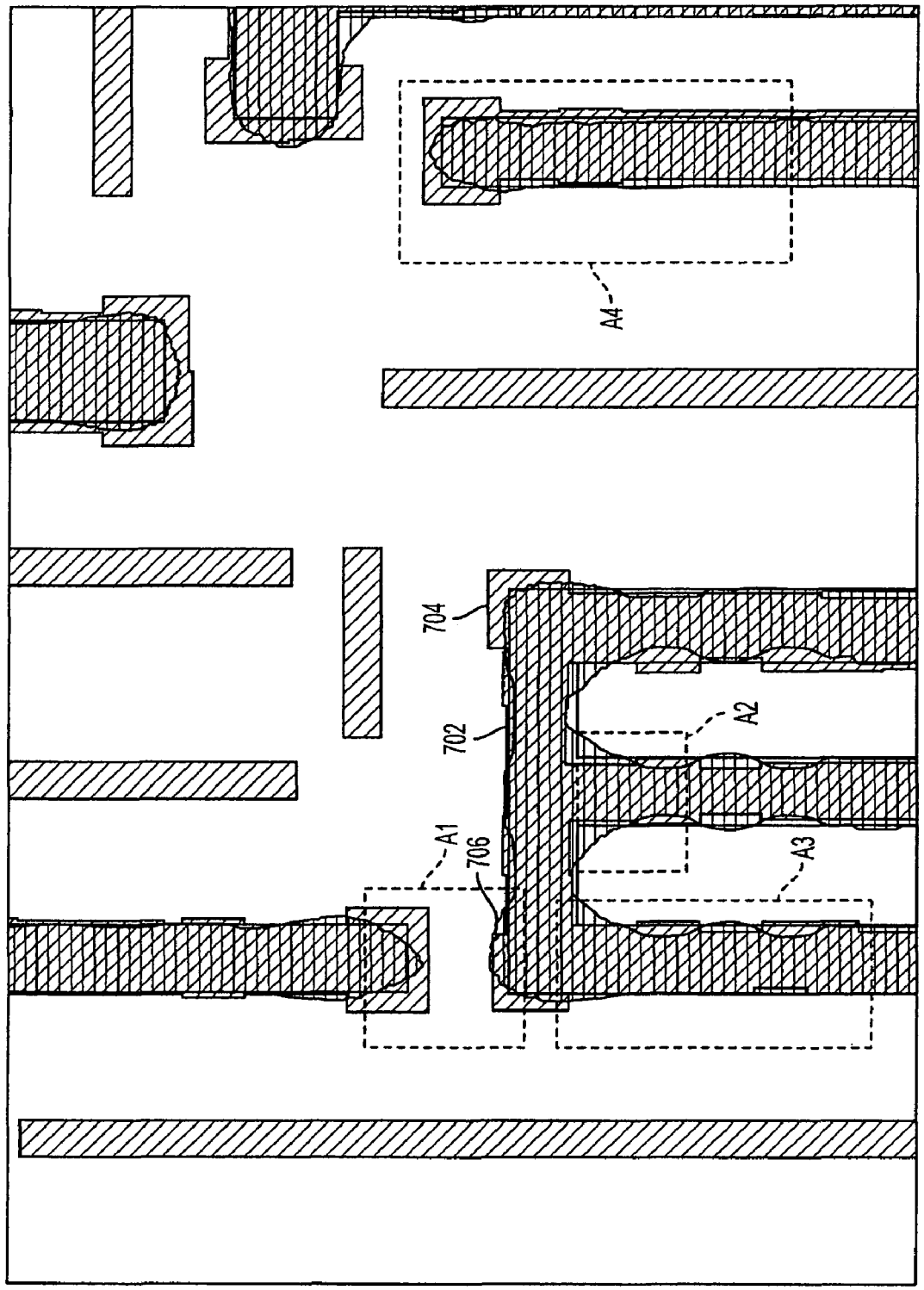
FIG. 9 illustrates an exemplary target image, predicted image and modified mask design based on the middle deviation value for each section.
Figure 10:
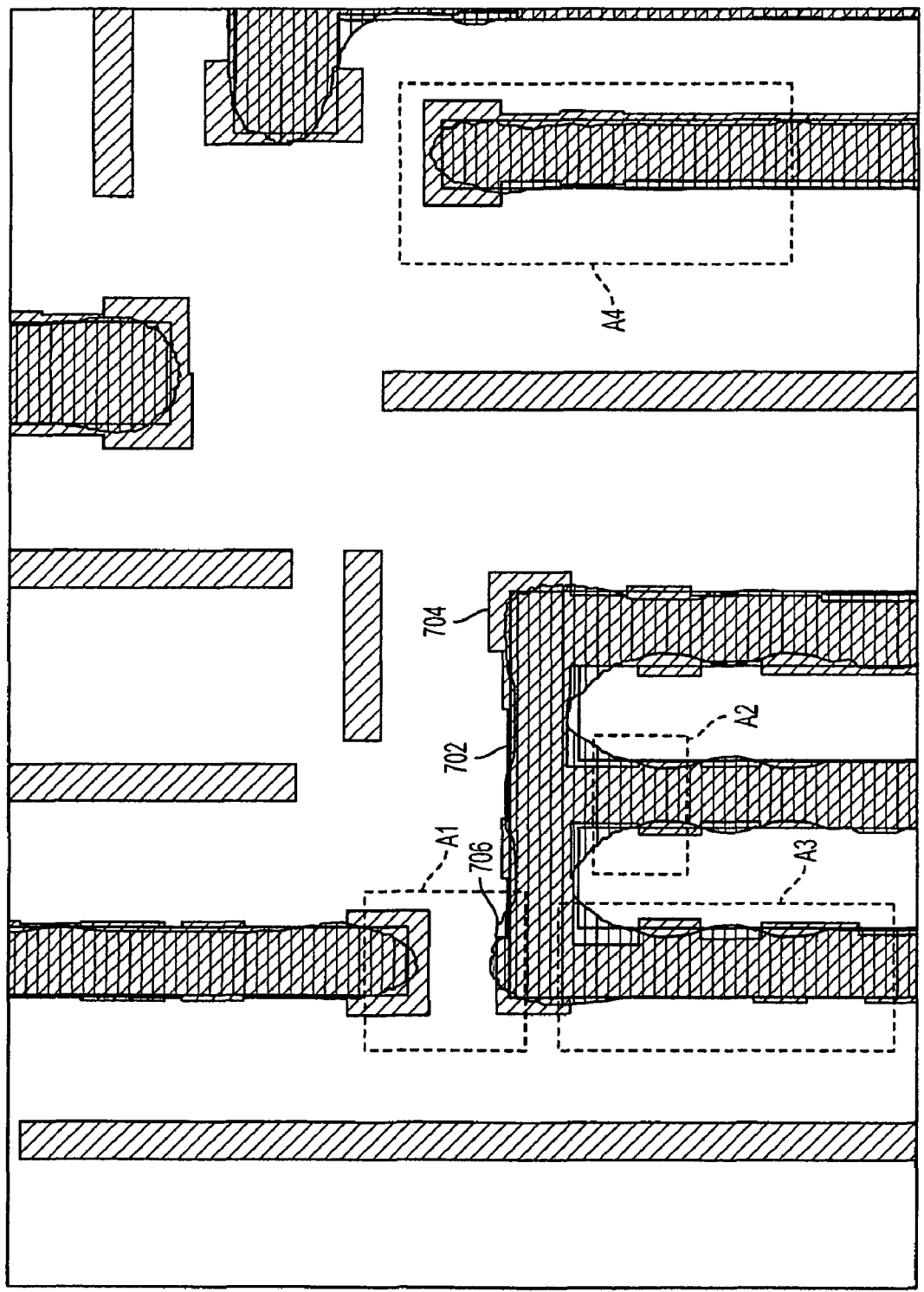
FIG. 10 illustrates an exemplary target image, predicted image and modified mask design based on the mean deviation value for each section.
Figure 11:
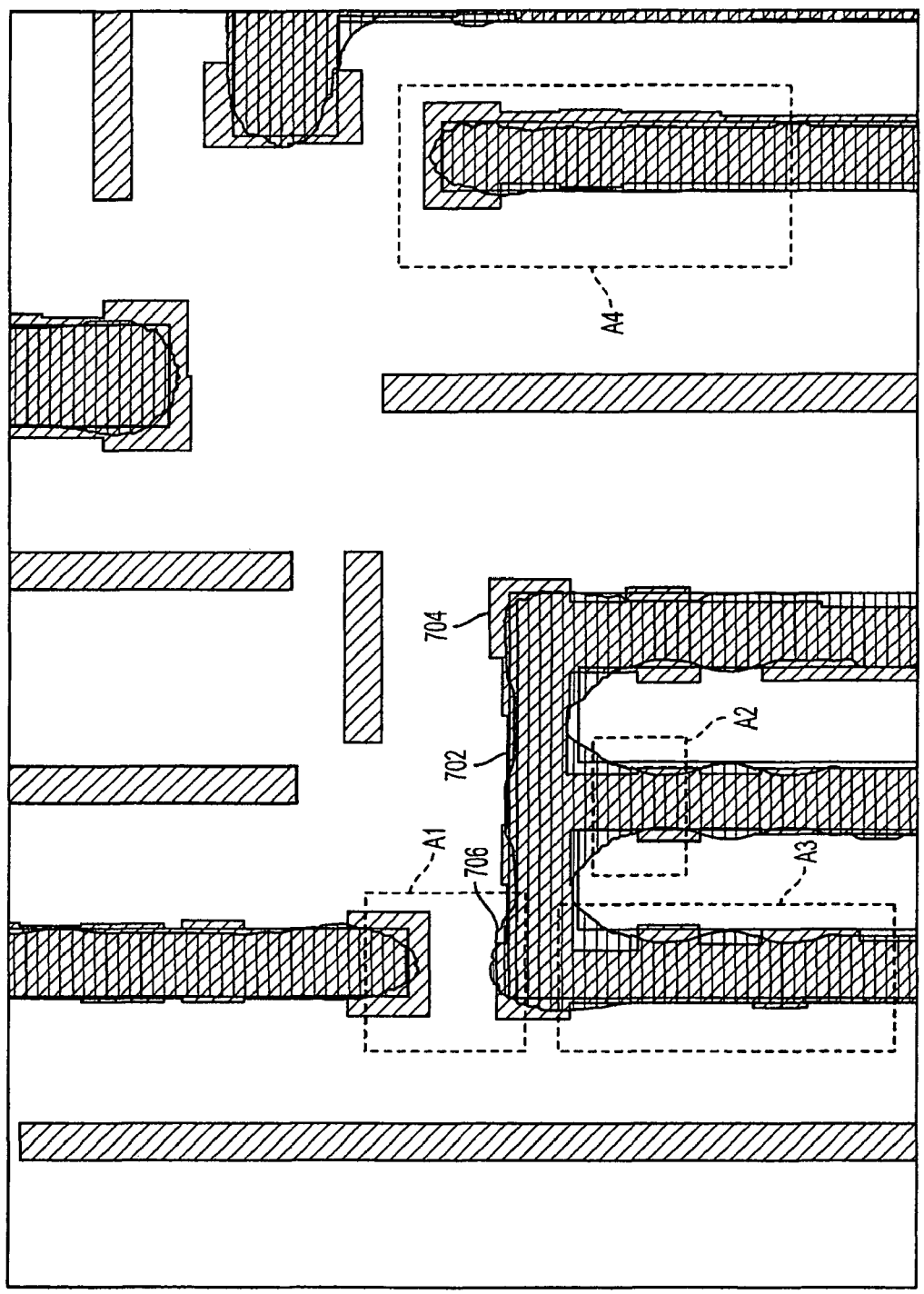
FIG. 11 illustrates an exemplary target image, predicted image and modified mask design based on the median deviation value for each section.

|  | FIG. 7 (Minimum) | FIG. 8 (Maximum) | FIG. 9 (Middle) | FIG. 10 (Mean) | FIG. 11 (Median) |
|---|---|---|---|---|---|
| A1 (Bridging) | Minimal | Severe | Strong Protection Against | Slightly Better than in FIG. 9 | Slightly Better than in FIG. 10 |
| A2 (Necking) | Severe | Minimal | Limits Extreme or Severe Necking | Slightly Poorer than in FIG. 9 | Slightly Better than in FIG. 10 |
| A3 (Line Smoothness) | Some Control | Average Control | Poor Control | Average Control | Best |
| A4 (Avg. Line Width) | Average Control | Average Control | Average Control | Best | Slightly Poorer than in FIG. 10 |

Based on the simulations above for the given pattern, the predicted pattern using median calculation (FIG. 11) has the best overall characteristics, i.e., it is the most robust. However, it should be noted that the simulations are representative of the given pattern. Other calculation methods may render a best overall predicted pattern for the given pattern. Alternatively, other calculation method(s) may be better or best suited for other types of patterns.

Figure 12:
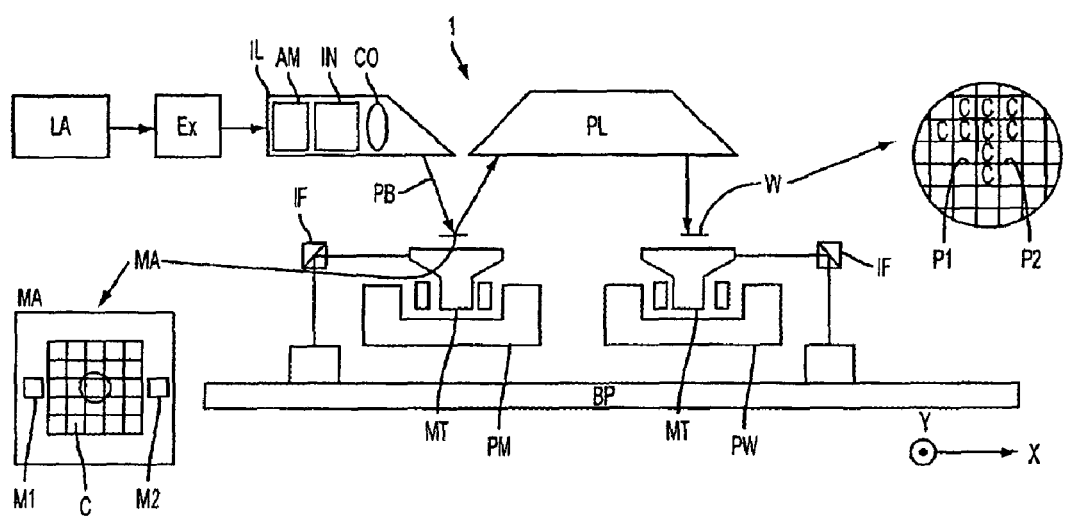
FIG. 12 illustrates an exemplary lithographic projection apparatus for use with a mask designed with the aid of the disclosed concepts.

FIG. 12 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e., has a transmissive mask). However, in general, it may also be of a reflective type, for example with a reflective mask. Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash." Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultraviolet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high-energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The concepts disclosed herein may be used as a simulator, i.e., as a computer program product capable of being implemented on a computer system. Software functionalities of the computer system involve programming, including executable code, which may be used to implement the above-described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media and volatile media. Non-volatile media include, for example, optical or magnetic disks, such as any of the storage devices in any computer(s) operating as one of the server platform, discussed above. Volatile media include dynamic memory, such as main memory of such a computer platform. Common forms of computer-readable media therefore include, for example: a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A computer-implemented method of optimizing a design to be formed on a substrate utilizing a mask, comprising the steps of:
    (a) identifying a plurality of evaluation points for each section of a plurality of sections of a target design and a corresponding predicted image of the target design;
    (b) selectively performing, by the computer, at least one of a plurality of calculations on the plurality of evaluation points, the selection of the at least one calculation to perform being determined according to a determined characteristic of the target design; and
    (c) modifying a design of the mask at locations corresponding to each section based on a result of step (b).

2. The method of optimizing the design, according to claim 1, further comprising the steps of
    (i) dividing the target design into the plurality of sections; and
    (ii) dividing the predicted image of the target design into a corresponding plurality of sections.

3. The method of optimizing the design, according to claim 1, further comprising the steps of:
    (i) identifying a section type for each of the plurality of sections; and
    (ii) determining whether each section type corresponds to a corner of the design.

4. The method of optimizing the design, according to claim 3, wherein when the section type corresponds to the corner, further comprising the step of not modifying the design of the mask at a location corresponding to the section that corresponds to the corner.

5. The method of optimizing the design, according to claim 3, wherein when the section type corresponds to the corner, further comprising the step of identifying whether the corner is a concave corner or a convex corner.

6. The method of optimizing the design, according to claim 5, wherein the corner is the concave corner, further comprising the steps of:
    (i) determining a minimum deviation value from the plurality of evaluation points of the section; and
    (ii) modifying the design of the mask at a location corresponding to the section corresponding to the concave corner based on the minimum deviation value.

7. The method of optimizing the design, according to claim 5, wherein the corner is the convex corner, further comprising the steps of:
    (i) determining a maximum deviation value from the plurality of evaluation points of the section; and
    (ii) modifying the design of the mask at a location corresponding to the section corresponding to the convex corner based on the maximum deviation value.

8. The method of optimizing the design, according to claim 1, further comprising the steps of:
    (i) determining a calculation for each section of the plurality of sections according to each section type;
    (ii) evaluating a deviation at each section based on the corresponding calculation identified in step (i);
    (iii) modifying the design of the mask at locations corresponding to each of the plurality of sections based on the results of step (ii).

9. The method of optimizing the design, according to claim 8, further comprising the step of identifying each section type of the plurality of sections.

10. The method of optimizing the design, according to claim 8, wherein a calculation for each section is selected from a group consisting of minimum, maximum, middle, mean and median calculations.

11. The method of optimizing the design, according to claim 1, for a given section of the plurality of sections, further comprising the steps of:
(i) determining a deviation at each of the evaluation points of the given section;
(ii) determining the deviation at each of a predetermined number of evaluation points of a section adjacent to the given section;
(iii) modifying the design of the mask at a location corresponding to the given section based on an evaluation of the deviation at each of the evaluation points of step (i) and at each of the evaluation points of step (ii).

12. The method of optimizing the design, according to claim 11, further comprising the step of modifying the design of the mask at a location corresponding to a corner section by an adjustment factor.

13. The method of optimizing the design, according to claim 1, for a given section, further comprising the steps of:
(i) evaluating the plurality of evaluation points of the given section by determining at least two deviation values comprising a first deviation value for the given section based on a first calculation and a second deviation value for the given section based on a second calculation;
(ii) determining a resulting deviation value based on the at least two deviation values; and
(iii) modifying the design of the mask at a location corresponding to the given section based on a result of step (ii).

14. The method of optimizing the design, according to claim 13, wherein the first calculation is selected from a group consisting of minimum, maximum, middle, mean and median calculations and the second calculation corresponds to a different calculation selected from the group.

15. The method of optimizing the design, according to claim 13, wherein the at least two deviation values further comprises a third deviation value for the given section based on a third calculation.

16. The method of optimizing the design, according to claim 15, wherein the first, second and third calculations correspond to three calculations selected from the group consisting of minimum, maximum, middle, mean and median calculations.

17. The method of optimizing the design, according to claim 13, wherein step (ii) further comprises the step of determining the resulting deviation value by averaging the first deviation value and the second deviation value.

18. A computer program product, comprising executable code transportable by at least one non-transitory machine readable medium, wherein execution of the code by at least one programmable computer causes the at least one programmable computer to perform a sequence of steps as in any of one claims 1-17 for optimizing the design to be formed on the substrate utilizing a design of the mask.

* * * * *